United States Patent
Robbins et al.

(10) Patent No.: US 10,354,994 B2
(45) Date of Patent: Jul. 16, 2019

(54) ELECTROSTATIC DISCHARGE (ESD) PROTECTION IN AN ELECTRONIC SWITCHING CIRCUIT

(71) Applicant: Qorvo US, Inc., Greensboro, NC (US)

(72) Inventors: David Robbins, Kernersville, NC (US); Swaminathan Muthukrishnan, Waltham, MA (US)

(73) Assignee: Qorvo US, Inc., Greensboro, NC (US)

( * ) Notice: Subject to any disclaimer, the term of this patent is extended or adjusted under 35 U.S.C. 154(b) by 343 days.

(21) Appl. No.: 15/298,430

(22) Filed: Oct. 20, 2016

(65) Prior Publication Data

US 2017/0278840 A1 Sep. 28, 2017

Related U.S. Application Data

(60) Provisional application No. 62/312,903, filed on Mar. 24, 2016.

(51) Int. Cl.
*H02H 9/00* (2006.01)
*H01L 27/02* (2006.01)

(52) U.S. Cl.
CPC ...... *H01L 27/0285* (2013.01); *H01L 27/0288* (2013.01); *H01L 27/0292* (2013.01)

(58) Field of Classification Search
None
See application file for complete search history.

(56) References Cited

U.S. PATENT DOCUMENTS

| 6,433,985 B1* | 8/2002 | Voldman | H01L 27/0251 361/111 |
| 9,064,704 B2* | 6/2015 | Takatani | H01L 27/0266 |
| 2012/0262828 A1 | 10/2012 | Muthukrishnan et al. | |

OTHER PUBLICATIONS

Chen, Yuh-Yue et al., "ESD Considerations for SOI Switch Design," 2011 IEEE International SOI Conference (SOI), Oct. 2011, IEEE, 2 pages.
Kohama, Kazumasa et al., "An Antenna Switch MMIC for GSM/UMTS Handsets Using E/D-Mode JPHEMT Technology," 2005 IEEE Radio Frequency Integrated Circuits (RFIC) Symposium, Jun. 2005, IEEE, pp. 509-512.

(Continued)

*Primary Examiner* — Stephen W Jackson
(74) *Attorney, Agent, or Firm* — Withrow & Terranova, P.L.L.C.

(57) ABSTRACT

Aspects disclosed herein include electrostatic discharge (ESD) protection in an electronic switching circuit. An electronic switching circuit includes switching circuitry configured to provide interconnectivity between a common port in at least one common branch and an input/output (I/O) port in at least one I/O branch. The common branch and the I/O branch each include a blocking capacitor element that is inherently incapable for ESD discharging. As such, an ESD clamp is disposed in parallel to the blocking capacitor element to provide a low-impedance ESD discharging path around the blocking capacitor element. By disposing the ESD clamp in parallel to the blocking capacitor element, it is possible to minimize detrimental parasitic effects of the ESD clamp, thus improving performance and reliability of the electronic switching circuit, especially for high power switching circuits such as a radio frequency (RF) switching circuits.

20 Claims, 13 Drawing Sheets

(56) References Cited

OTHER PUBLICATIONS

Muthukrishnan, Swaminathan et al., "A Novel clamp based ESD protection structure for high power RF ports in GaAs pHEMT process," IEEE Compound Semiconductor IC Symposium Digest, Oct. 2011, IEEE, pp. 83-86.

Muthukrishnan, Swaminathan et al., "A Novel On-Chip Protection Circuit for RFICs Implemented in D-Mode PHEMT Technology," EOS/ESD Symposium, Sep. 2007, IEEE, pp. 4A.3-1 to 4A.3-7.

* cited by examiner

ELECTROSTATIC DISCHARGE (ESD) PROTECTION IN AN ELECTRONIC SWITCHING CIRCUIT

RELATED APPLICATIONS

This application claims the benefit of U.S. Provisional Patent Application Ser. No. 62/312,903, filed Mar. 24, 2016, the disclosure of which is incorporated herein by reference in its entirety.

FIELD OF THE DISCLOSURE

The technology of the disclosure relates generally to protecting integrated circuits (ICs) from electrostatic discharge (ESD) during fabrication, production, and operation.

BACKGROUND

Mobile communication devices have become increasingly common in current society. The prevalence of these mobile communication devices is driven in part by the many functions that are now enabled on such devices. Demand for such functions increases the processing capability requirements for the mobile communication devices. As a result, increasingly complex integrated circuits (ICs) have been designed and manufactured to provide increasingly greater functionality in the mobile communication devices. Concurrent with the increase in complexity of the ICs, there has been pressure to decrease the footprint of the ICs as well.

It has become more challenging to increase yields and improve quality of the ICs during fabrication and production processes. As such, there is a growing interest in the effect of electrostatic discharge (ESD) during fabrication of the ICs, assembly of devices that use the ICs, and the operation of the ICs. ESD can be seen as a miniature lightning bolt of static charge between two surfaces that have different electrical potentials. Without proper protection, static charge movement associated with ESD may generate an electrical current high enough to damage or even destroy the passive and active devices, such as diodes and transistors, thus, rendering the ICs dysfunctional.

SUMMARY

Aspects disclosed herein include electrostatic discharge (ESD) protection in an electronic switching circuit. An electronic switching circuit includes switching circuitry configured to provide interconnectivity between a common port in at least one common branch and an input/output (I/O) port in at least one I/O branch. The common branch and the I/O branch each include a blocking capacitor element that is inherently incapable for ESD discharging. As such, an ESD clamp is disposed in parallel to the blocking capacitor element to provide a low-impedance ESD discharging path around the blocking capacitor element. By disposing the ESD clamp in parallel to the blocking capacitor element, it is possible to minimize detrimental parasitic effects of the ESD clamp, thus improving performance and reliability of the electronic switching circuit, especially for high power switching circuits such as a radio frequency (RF) switching circuit.

In one aspect, an electronic switching circuit is provided. The electronic switching circuit includes switching circuitry. The electronic switching circuit also includes at least one common branch comprising a first blocking capacitor element provided between a common port and the switching circuitry. The electronic switching circuit also includes at least one I/O branch comprising a second blocking capacitor element provided between the switching circuitry and an I/O port. The electronic switching circuit also includes a common branch ESD clamp disposed in parallel to the first blocking capacitor element for discharging an ESD event around the first blocking capacitor element. The electronic switching circuit also includes an I/O branch ESD clamp disposed in parallel to the second blocking capacitor element for discharging the ESD event around the second blocking capacitor element.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed herein include electrostatic discharge (ESD) protection in an electronic switching circuit. An electronic switching circuit includes switching circuitry configured to provide interconnectivity between a common port in at least one common branch and an input/output (I/O) port in at least one I/O branch. The common branch and the I/O branch each include a blocking capacitor element that is inherently incapable for ESD discharging. As such, an ESD clamp is disposed in parallel to the blocking capacitor element to provide a low-impedance ESD discharging path around the blocking capacitor element. By disposing the ESD clamp in parallel to the blocking capacitor element, it is possible to minimize detrimental parasitic effects of the ESD clamp, thus improving performance and reliability of the electronic switching circuit, especially for high power switching circuits such as a radio frequency (RF) switching circuit.

Figure 1:
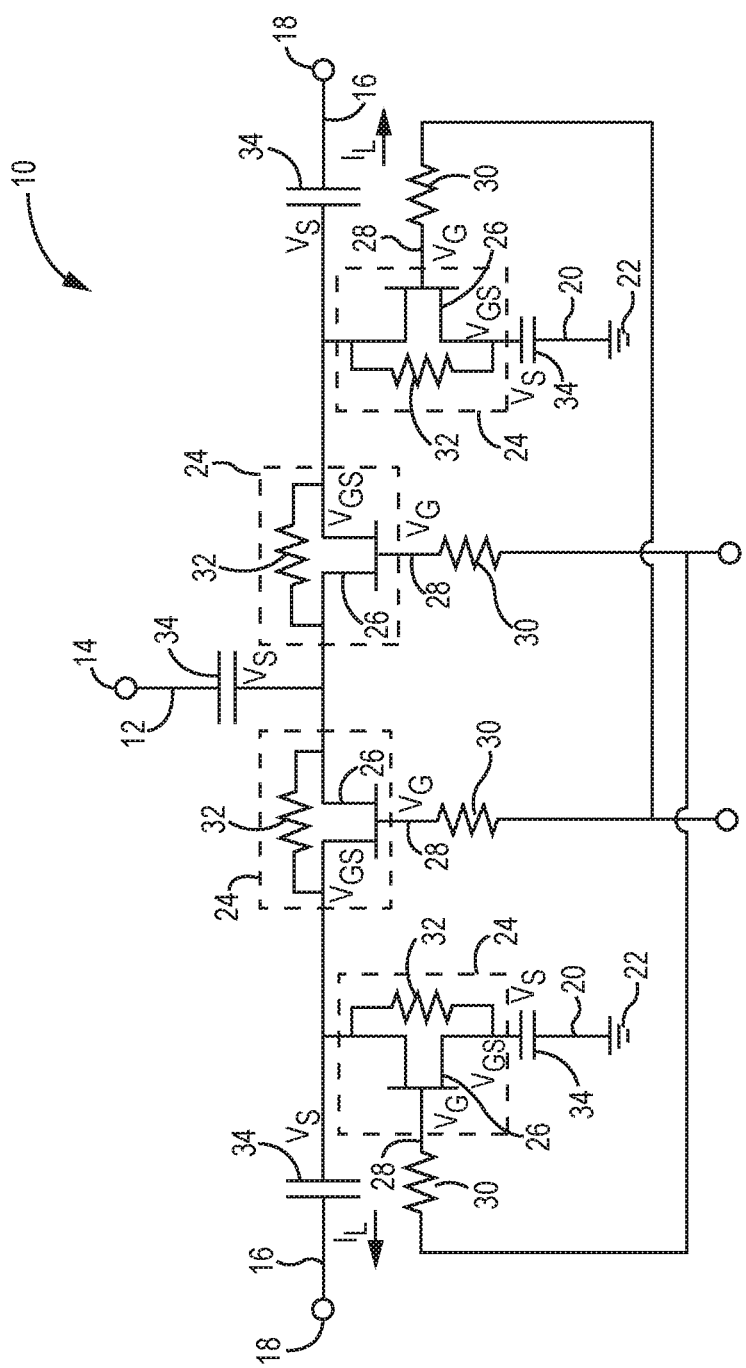
FIG. 1 is a schematic diagram of an electronic switching circuit that is unprotected from electrostatic discharge (ESD)

Before discussing the ESD protection concepts of the present disclosure, a brief overview of an electronic switching circuit without ESD protection is provided with reference to FIG. 1. The discussion of specific exemplary aspects of ESD protection in an electronic switching circuit starts below with reference to FIG. 2.

In this regard, FIG. 1 is a schematic diagram of an electronic switching circuit 10 that is unprotected from ESD. In a non-limiting example, the electronic switching circuit 10 is an RF switching circuit that includes a common branch 12 coupled to a common port 14 (e.g., an antenna port). The electronic switching circuit 10 includes one or more I/O branches 16 coupled to one or more I/O ports 18, such as an RF receiver (RX) port and an RF transmitter (TX) port, for example. The electronic switching circuit 10 also includes one or more shunt branches 20 coupled to a ground rail 22. The electronic switching circuit 10 includes switches 24 for selectively coupling the common branch 12, the I/O branches 16, and the shunt branches 20.

The switches 24 are designed in a Gallium Arsenide (GaAs) pseudomorphic High Electron Mobility Transistor (pHEMT) (GaAs pHEMT) process using Depletion mode Field Effect Transistors (D-FETs) 26. Each of the D-FETs 26 has a gate electrode 28 coupled to a resistor 30 and is placed in an "ON" mode when a gate voltage $V_G$ applied to the gate electrode 28 causes a gate-to-source voltage $V_{GS}$ to be lower than a positive threshold voltage $V_{TH}$ (for a p-type D-FET) or higher than a negative threshold voltage $-V_{TH}$ (for an n-type D-FET). In contrast, each of the D-FETs 26 is placed in an "OFF" mode when the gate voltage $V_G$ causes the gate-to-source voltage $V_{GS}$ to be higher than the positive threshold voltage $V_{TH}$ (for a p-type D-FET) or lower than the negative threshold voltage $-V_{TH}$ (for an n-type D-FET). In this regard, the D-FETs 26 are also known as gate-controlled D-FETs. Accordingly, the switches 24 are often referred to as gate-controlled GaAs pHEMT switches, which are controlled by the gate voltage $V_G$. The switches 24 include a large resistor 32 disposed in parallel to the D-FETs 26, respectively, to maintain a constant direct-current (DC) voltage across the common branch 12, the I/O branches 16, and the shunt branches 20.

A blocking capacitor element 34 (e.g., a DC blocking element) is provided in each of the common branch 12, the I/O branches 16, and the shunt branches 20. Each blocking capacitor element 34 has a switch-side voltage $V_S$ that is determined by the gate voltage $V_G$ of the respective switches 24 and revise diode leakage $I_L$ through the respective resistor 30. In this regard, the blocking capacitor element 34 maintains a DC open circuit during normal operations of the electronic switching circuit 10. As such, the blocking capacitor element 34 makes it inherently difficult to provide a low-impedance path for discharging an ESD event in the common branch 12, the I/O branches 16, and the shunt branches 20.

Traditional ESD protection circuits, such as a diode stack, may be employed to provide ESD protection for the electronic switching circuit 10. However, given that the common port 14 and the I/O ports 18 are sensitive to parasitic loading, such traditional ESD protection circuits may compromise reliability and performance of the electronic switching circuit 10. In addition, the diode stack may lead to significant increase of footprint of the electronic switching circuit 10. In this regard, it may be desired to provide ESD protection in the electronic switching circuit 10 without compromising reliability, performance, and footprint of the electronic switching circuit 10.

Figure 2:
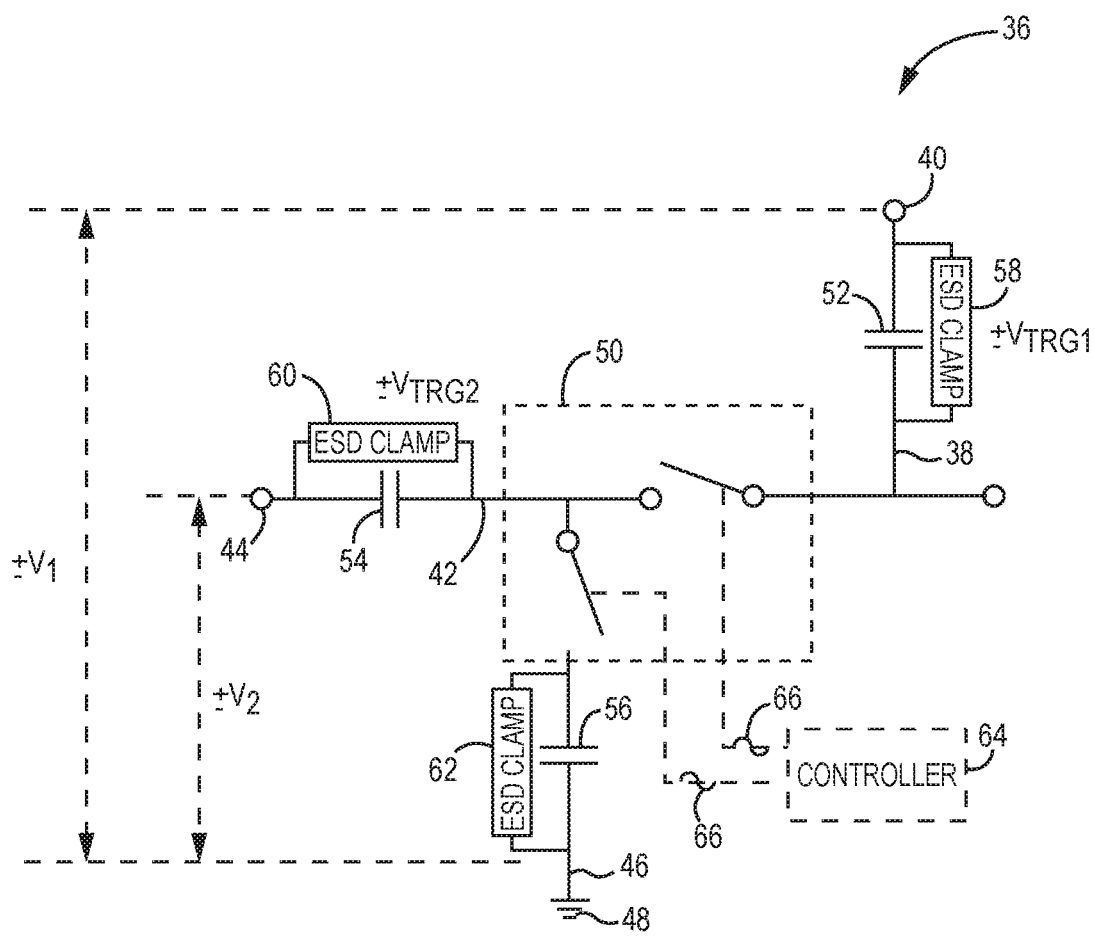
FIG. 2 is a schematic diagram of an exemplary electronic switching circuit configured to discharge an ESD event around a blocking capacitor element(s) by disposing an ESD clamp(s) in parallel to the blocking capacitor element(s)

In this regard, FIG. 2 is a schematic diagram of an exemplary electronic switching circuit 36 configured to discharge an ESD event around a blocking capacitor element(s) by disposing an ESD clamp(s) in parallel to the blocking capacitor element(s). As discussed in more detail below, the ESD clamp(s) disposed in parallel to the blocking capacitor element(s) provides a low-impedance discharging path when the ESD event occurs in the electronic switching circuit 36, and has no impact on the blocking capacitor element(s) during normal operation of the electronic switching circuit 36. Further, by disposing the ESD clamp(s) in parallel to the blocking capacitor element(s), it is possible to minimize parasitic effects (e.g., parasitic capacitance) of the ESD clamp(s), thus helping to improve reliability and performance of the electronic switching circuit 36.

The electronic switching circuit 36 includes at least one common branch 38 coupled to a common port 40, at least one I/O branch 42 coupled to an I/O port 44, and at least one shunt branch 46 coupled to a ground rail 48. The electronic switching circuit 36 also includes switching circuitry 50 for providing interconnectivity between the common port 40 and the I/O port 44. In a non-limiting example, the switching circuitry 50 includes one or more gate-controlled GaAs pHEMT switches.

The common branch 38 includes a first blocking capacitor element 52 provided between the common port 40 and the switching circuitry 50. The I/O branch 42 includes a second blocking capacitor element 54 disposed between the I/O port 44 and the switching circuitry 50. The shunt branch 46 includes a third blocking capacitor element 56 provided between the switching circuitry 50 and the ground rail 48. In a non-limiting example, at least one blocking capacitor element among the first blocking capacitor element 52, the second blocking capacitor element 54, and the third blocking capacitor element 56 is a DC blocking element or a matching element. Each of the first blocking capacitor element 52, the second blocking capacitor element 54, and the third blocking capacitor element 56 is configured to maintain a DC open circuit during normal operations of the electronic switching circuit 36. As such, the first blocking capacitor element 52, the second blocking capacitor element 54, and the third blocking capacitor element 56 are inherently incapable of providing the low-impedance ESD discharging path during the ESD event.

With continuing reference to FIG. 2, the ESD event occurs at the common port 40 when a first positive voltage spike $V_1$ or a first negative voltage spike $-V_1$ is placed between the common port 40 and the ground rail 48. Likewise, the ESD event occurs at the I/O port 44 when a second positive voltage spike $V_2$ or a second negative voltage spike $-V_2$ is placed between the I/O port 44 and the ground rail 48. For the convenience of reference, the ESD event triggered by the first positive voltage spike $V_1$ and/or the second positive voltage spike $V_2$ is hereinafter referred to as a "positive ESD event." The ESD event triggered by the first negative voltage spike $-V_1$ and/or the second negative voltage spike $-V_2$ is hereinafter referred to as a "negative ESD event."

To protect the common port 40 from being damaged during the positive ESD event and the negative ESD event, the first positive voltage spike $V_1$ or the first negative voltage spike $-V_1$ needs to be discharged instantaneously from the common port 40 to either the ground rail 48 or neighbor pins. Likewise, to protect the I/O port 44 from being damaged during the positive ESD event and the negative ESD event, the second positive voltage spike $V_2$ or the second negative voltage spike $-V_2$ needs to be discharged instantaneously from the I/O port 44 to the ground rail 48 or neighboring pins. As such, it is necessary to provide low-impedance ESD discharging paths around the first blocking capacitor element 52, the second blocking capacitor element 54, and/or the third blocking capacitor element 56 for discharging the positive ESD event and the negative ESD event in the electronic switching circuit 36.

In this regard, a common branch ESD clamp 58 is disposed in parallel to the first blocking capacitor element 52 to provide a low-impedance path in the common branch 38 for discharging the positive ESD event and the negative ESD event around the first blocking capacitor element 52. Similarly, an I/O branch ESD clamp 60 is disposed in parallel to the second blocking capacitor element 54 to provide a low-impedance path in the I/O branch 42 for discharging the positive ESD event and the negative ESD event around the second blocking capacitor element 54. The common branch ESD clamp 58 and the I/O branch ESD clamp 60 may be symmetrical ESD clamps, which will be further discussed later in reference to FIGS. 3A-3C. Further, a shunt branch ESD clamp 62 is disposed in parallel to the third blocking capacitor element 56 to provide a low-impedance path in the shunt branch 46 for discharging the positive ESD event and the negative ESD event around the third blocking capacitor element 56 to the ground rail 48. In one non-limiting example, the shunt branch ESD clamp 62 is the same symmetrical ESD clamp as the common branch ESD clamp 58 and the I/O branch ESD clamp 60. In another non-limiting example, the shunt branch ESD clamp 62 is an asymmetrical ESD clamp, which is further discussed later in reference to FIG. 4. By disposing the common branch ESD clamp 58, the I/O branch ESD clamp 60, and the shunt branch ESD clamp 62 in parallel to the first blocking capacitor element 52, the second blocking capacitor element 54, and the third blocking capacitor element 56, respectively, it is possible to minimize the parasitic effects (e.g., parasitic capacitance) associated with the common branch ESD clamp 58, the I/O branch ESD clamp 60, and the shunt branch ESD clamp 62, thus helping to improve reliability and performance of the electronic switching circuit 36.

With continuing reference to FIG. 2, when the positive ESD event occurs at the common port 40, the first positive voltage spike $V_1$ will be higher than a first positive trigger voltage $V_{TRG1}$ of the common branch ESD clamp 58. In contrast, when the negative ESD event occurs at the common port 40, the first negative voltage spike $-V_1$ will be lower than a first negative trigger voltage $-V_{TRG1}$ of the common branch ESD clamp 58. In either case, the common branch ESD clamp 58 will be turned ON to discharge the positive ESD event and the negative ESD event around the first blocking capacitor element 52. The first positive voltage spike $V_1$ and the first negative voltage spike $-V_1$ will also cause the shunt branch ESD clamp 62 to be turned ON. Further, the switching circuitry 50 is configured to couple the common branch ESD clamp 58 to the shunt branch ESD clamp 62, thus allowing the positive ESD event and the negative ESD event to be discharged from the common port 40 to the ground rail 48 via the shunt branch ESD clamp 62. In a non-limiting example, a controller 64 is configured to control the switching circuitry 50 via a control signal(s) 66, which may be based on positive or negative voltage(s).

When the positive ESD event occurs at the I/O port 44, the second positive voltage spike $V_2$ will be higher than a second positive trigger voltage $V_{TRG2}$ of the I/O branch ESD clamp 60. In contrast, when the negative ESD event occurs at the I/O port 44, the second negative voltage spike $-V_2$ will be lower than a second negative trigger voltage $-V_{TRG2}$ of the I/O branch ESD clamp 60. In either case, the I/O branch ESD clamp 60 will be turned ON to discharge the positive ESD event and the negative ESD event around the second blocking capacitor element 54. The second positive voltage spike $V_2$ and the second negative voltage spike $-V_2$ will also cause the shunt branch ESD clamp 62 to be turned ON. Further, the switching circuitry 50 is configured to couple the I/O branch ESD clamp 60 to the shunt branch ESD clamp 62, thus allowing the positive ESD event and the negative ESD event to be discharged from the I/O port 44 to the ground rail 48 via the shunt branch ESD clamp 62. The controller 64 may be configured to control the switching circuitry 50 via the control signal(s) 66, which may be based on positive or negative voltage(s).

In a non-limiting example, the positive ESD event or the negative ESD event may occur at the common port 40 and the I/O port 44 substantially concurrently. In this event, the common branch ESD clamp 58, the I/O branch ESD clamp 60, and the shunt branch ESD clamp 62 will all be turned ON. Accordingly, the controller 64 may control the switching circuitry 50 to couple the common branch ESD clamp 58 and the I/O branch ESD clamp 60 to the shunt branch ESD clamp 62, thus allowing the positive ESD event and the negative ESD event to be discharged from the common port 40 and the I/O port 44 to the ground rail 48.

ESD discharging paths between the common port 40, the I/O port 44, and the ground rail 48, as discussed above, are merely non-limiting examples. It shall be appreciated that an actual ESD discharging path will be dependent on layout of the electronic switching circuit 36 as well as positive or negative voltage swings during the positive ESD event or the negative ESD event.

When the electronic switching circuit 36 is in normal operation mode without the ESD event, a DC voltage may be placed between the common port 40 and the ground rail 48 and/or between the I/O port 44 and the ground rail 48. The DC voltage is configured to be lower than the first positive trigger voltage $V_{TRG1}$ (or higher than the first negative trigger voltage $-V_{TRG1}$) to keep the common branch ESD clamp 58 in the OFF mode. Likewise, the DC voltage is also configured to be lower than the second positive trigger voltage $V_{TRG2}$ (or higher than the second negative trigger voltage $-V_{TRG2}$) to keep the I/O branch ESD clamp 60 in the OFF mode. In this regard, there will be no low-impedance path around the first blocking capacitor element 52 and the second blocking capacitor element 54. As a result, the first blocking capacitor element 52 and the second blocking capacitor element 54 can maintain the DC open circuit during the normal operation of the electronic switching circuit 36.

As mentioned earlier, the common branch ESD clamp 58, the I/O branch ESD clamp 60, and the shunt branch ESD clamp 62 may be provided as symmetrical ESD clamps. In this regard, FIG. 3A is a schematic diagram of an exemplary symmetrical ESD clamp 68 that may be disposed in parallel to the first blocking capacitor element 52, the second blocking capacitor element 54, and the third blocking capacitor element 56 of FIG. 2.

Figure 3:
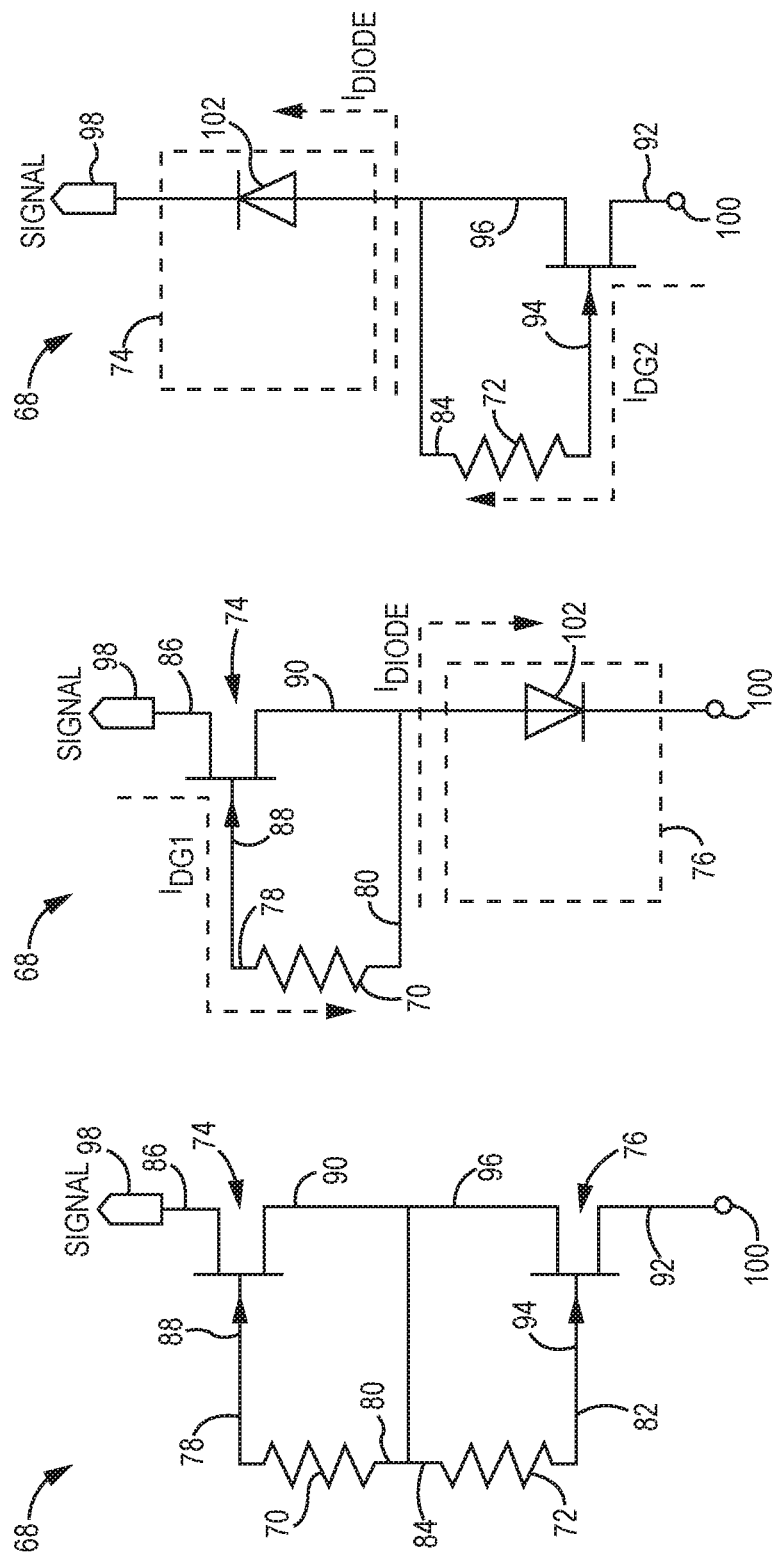
FIG. 3A is a schematic diagram of an exemplary symmetrical ESD clamp that may be disposed in parallel to the blocking capacitor element(s) of FIG. 2.
FIG. 3B is a schematic diagram providing an exemplary illustration of the operation principles of the symmetrical ESD clamp of FIG. 3A during a positive ESD event.
FIG. 3C is a schematic diagram providing an exemplary illustration of the operation principles of the symmetrical ESD clamp of FIG. 3A during a negative ESD event.

With reference to FIG. 3A, the symmetrical ESD clamp 68 includes a first trigger resistor 70 and a second trigger resistor 72. In a non-limiting example, the first trigger resistor 70 and the second trigger resistor 72 have a substantially equal resistance. The symmetrical ESD clamp 68 also includes a first transistor 74 and a second transistor 76. In a non-limiting example, the first transistor 74 and the second transistor 76 are substantially identical Enhancement mode Field Effect Transistors (E-FETs).

The first trigger resistor 70 includes a first gate end 78 and a first source end 80. The second trigger resistor 72 includes a second gate end 82 and a second source end 84. The first transistor 74 includes a first drain electrode 86, a first gate electrode 88, and a first source electrode 90. The second transistor 76 includes a second drain electrode 92, a second gate electrode 94, and a second source electrode 96.

The first drain electrode 86 of the first transistor 74 is coupled to a signal node 98. When the symmetrical ESD clamp 68 is disposed in parallel to the first blocking capacitor element 52, the signal node 98 is coupled to the common port 40 of FIG. 2. When the symmetrical ESD clamp 68 is disposed in parallel to the second blocking capacitor element 54, the signal node 98 is coupled to the I/O port 44 of FIG. 2. When the symmetrical ESD clamp 68 is disposed in parallel to the third blocking capacitor element 56, the signal node 98 is coupled to the switching circuitry 50 of FIG. 2. According to previous discussions in FIG. 2, the signal node 98 requires protection from the positive ESD event and the negative ESD event. The first gate end 78 of the first trigger resistor 70 is coupled to the first gate electrode 88 of the first transistor 74. The first source electrode 90 of the first transistor 74 is coupled to the first source end 80 of the first trigger resistor 70 and the second source end 84 of the second trigger resistor 72. The second gate electrode 94 of the second transistor 76 is coupled to the second gate end 82 of the second trigger resistor 72. The second source electrode 96 of the second transistor 76 is coupled to the first source electrode 90 of the first transistor 74. The second drain electrode 92 of the second transistor 76 is coupled to an output node 100. When the symmetrical ESD clamp 68 is disposed in parallel to the first blocking capacitor element 52 or in parallel to the second blocking capacitor element 54, the output node 100 can be coupled to the switching circuitry 50 of FIG. 2. When the symmetrical ESD clamp 68 is disposed in parallel to the third blocking capacitor element 56, the output node 100 can be coupled to the ground rail 48 of FIG. 2.

During normal operation (no ESD events), the symmetrical ESD clamp 68 is OFF, and no current (except for very small leakage current) flows through the symmetrical ESD clamp 68. The operation principles of the symmetrical ESD clamp 68 in response to the positive ESD event and the negative ESD event are discussed next with reference to FIG. 3B and 3C, respectively. Common elements between FIGS. 2 and 3A-3C are shown therein with common element numbers and will not be re-described herein.

In this regard, FIG. 3B is a schematic diagram providing an exemplary illustration of the operation principles of the symmetrical ESD clamp 68 of FIG. 3A during the positive ESD event. During the positive ESD event, as voltage at the signal node 98 approaches (or exceeds) a drain-gate breakdown voltage of the first transistor 74, leakage in a drain-gate junction of the first transistor 74 increases, and a drain-gate breakdown current $I_{DG1}$ flows from the first drain electrode 86 to the first gate electrode 88, and then flows through the first trigger resistor 70. As a gate-source voltage between the first gate electrode 88 and the first source electrode 90 increases beyond a threshold voltage of the first transistor 74, the first transistor 74 will function as a clamp.

A small portion of the drain-gate breakdown current $I_{DG1}$ flows through the second trigger resistor 72 of FIG. 3A to the second gate electrode 94 of the second transistor 76 and turns on the second transistor 76. In this regard, the second transistor 76 acts as a forward-biased diode 102. The remainder of the drain-gate breakdown current $I_{DG1}$ flows through the second transistor 76 as an ESD discharge current $I_{DIODE}$.

FIG. 3C is a schematic diagram providing an exemplary illustration of the operation principles of the symmetrical ESD clamp 68 of FIG. 3A during the negative ESD event. The operation principles of the symmetrical ESD clamp 68 during the negative ESD event are similar to the operation principles of the symmetrical ESD clamp 68 during the positive ESD event, except operating in reverse. For more details on the operation principles of the symmetrical ESD clamp 68, please refer to U.S. patent application Ser. No. 13/446,697, filed Apr. 13, 2012, entitled "CLAMP BASED ESD PROTECTION CIRCUITS," now published as U.S. Patent Application Publication Number 2012/0262828 A1, the disclosure of which is incorporated herein by reference in its entirety.

Figure 4:
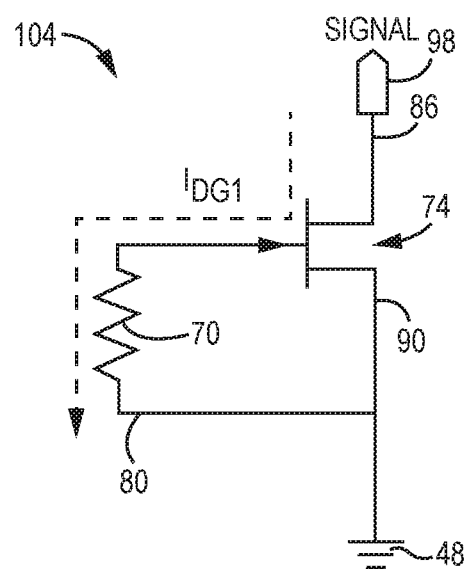
FIG. 4 is a schematic diagram of an exemplary asymmetrical ESD clamp that can be disposed in parallel to the blocking capacitor element(s) of FIG. 2.

FIG. 4 is a schematic diagram of an exemplary asymmetrical ESD clamp 104 that can be disposed in parallel to the third blocking capacitor element 56 of FIG. 2. Common elements between FIGS. 2, 3A, and 4 are shown therein with common element numbers and will not be re-described herein. The asymmetrical ESD clamp 104 includes only the first transistor 74 and the first trigger resistor 70. The first source electrode 90 and the first source end 80 of the first trigger resistor 70 are coupled to the ground rail 48. As such, the asymmetrical ESD clamp 104 may be disposed in parallel to the third blocking capacitor element 56 in the shunt branch 46.

Figure 5:
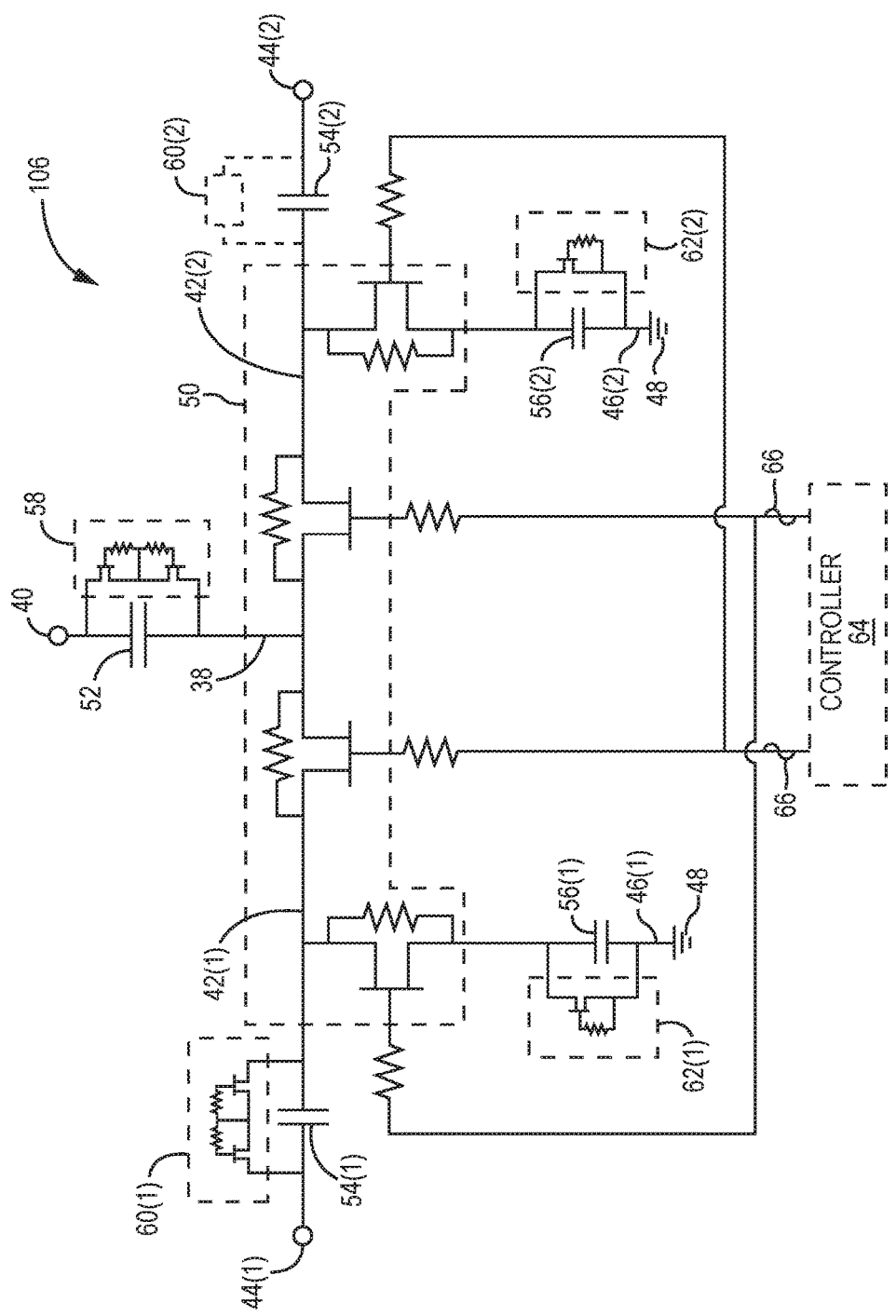
FIG. 5 is a schematic diagram of an exemplary radio frequency (RF) switching circuit configured to provide ESD protection according to configurations of the electronic switching circuit of FIG. 2.

The electronic switching circuit 36 of FIG. 2 can be an RF switching circuit. In this regard, FIG. 5 is a schematic diagram of an exemplary RF switching circuit 106 configured to provide ESD protection according to configurations of the electronic switching circuit 36 of FIG. 2. Common elements between FIGS. 2 and 5 are shown therein with common element numbers and will not be re-described herein. For the convenience of illustration, FIG. 5 is shown as a single-pole double-throw RF switching circuit. It shall be appreciated that the configuration and operation principles discussed herein are applicable to other types of RF switching circuits, such as single-pole multi-throw (SPnT) and multi-pole multi-throw (nPnT) RF switching circuits, as well.

In the RF switching circuit 106, the common port 40 serves as an RF antenna port to an RF antenna. The RF switching circuit 106 includes a first I/O branch 42(1) and a second I/O branch 42(2). A first I/O port 44(1) in the first I/O branch 42(1) serves as an RF receiver port to a receiver circuit. A second I/O port 44(2) in the second I/O branch 42(2) serves as an RF transmitter port to a transmitter circuit. The controller 64 controls the switching circuitry 50 to toggle the common port 40 between the first I/O port 44(1) and the second I/O port 44(2).

The first I/O branch 42(1) includes a receiver branch blocking capacitor element 54(1) provided between the switching circuitry 50 and the first I/O port 44(1). The second I/O branch 42(2) includes a transmitter branch blocking capacitor element 54(2) provided between the switching circuitry 50 and the second I/O port 44(2). The RF switching circuit 106 includes a receiver branch ESD clamp 60(1) disposed in parallel to the receiver branch blocking capacitor element 54(1) for discharging the positive ESD event and the negative ESD event around the receiver branch blocking capacitor element 54(1). The RF switching circuit 106 may include a transmitter branch ESD clamp 60(2) disposed in parallel to the transmitter branch blocking capacitor element 54(2) for discharging the positive ESD event and the negative ESD event around the transmitter branch blocking capacitor element 54(2). In a non-limiting example, the common branch ESD clamp 58, the receiver branch ESD clamp 60(1), and the transmitter branch ESD clamp 60(2) are the same as the symmetrical ESD clamp 68 of FIG. 3A.

The RF switching circuit 106 includes a first shunt branch 46(1) and a second shunt branch 46(2). The first shunt branch 46(1) includes a first shunt branch blocking capacitor element 56(1) provided between the switching circuitry 50 and the ground rail 48. The second shunt branch 46(2) includes a second shunt branch blocking capacitor element 56(2) provided between the switching circuitry 50 and the ground rail 48. The RF switching circuit 106 includes a first shunt branch ESD clamp 62(1) disposed in parallel to the first shunt branch blocking capacitor element 56(1). The RF switching circuit 106 includes a second shunt branch ESD clamp 62(2) disposed in parallel to the second shunt branch blocking capacitor element 56(2). In a non-limiting example, the first shunt branch ESD clamp 62(1) and the second shunt branch ESD clamp 62(2) are the same as the asymmetrical ESD clamp 104 of FIG. 4.

When the positive ESD event or the negative ESD event occurs at the common port 40, the controller 64 controls the switching circuitry 50 to couple the common branch ESD clamp 58 to the first shunt branch ESD clamp 62(1) and/or the second shunt branch ESD clamp 62(2) for discharging the positive ESD event or the negative ESD event to the ground rail 48.

Effectiveness of the RF switching circuit 106 in discharging the positive ESD event and the negative ESD event at the common port 40 can be illustrated via Transmission Line Pulsing (TLP) plots, as discussed next with reference to FIGS. 6A and 6B. In this regard, FIG. 6A is a TLP plot 108 providing an exemplary illustration of discharging the positive ESD event from the common port 40 (RF antenna port) in the RF switching circuit 106 of FIG. 5.

Figure 6A:
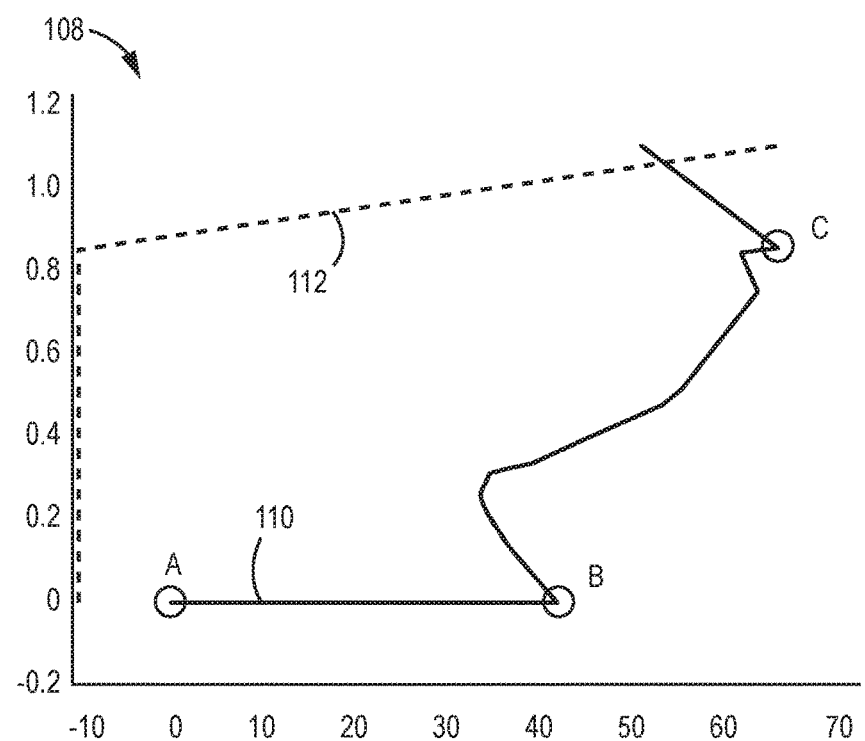
FIG. 6A is a Transmission Line Pulsing (TLP) plot providing an exemplary illustration of discharging a positive ESD event from an RF antenna port in the RF switching circuit of FIG. 5.

With reference to FIG. 6A, the TLP plot 108 includes a TLP voltage curve 110 indicating voltage changes at the common port 40 and a TLP current curve 112 indicating current changes in the RF switching circuit 106. At point A, there is a zero volt (0 V) TLP voltage at the common port 40 and the corresponding TLP current in the RF switching circuit 106 is zero milliamps (0 mA), indicating that the RF switching circuit 106 is OFF. At point B, the TLP voltage at the common port 40 reaches approximately forty volts (40 V), indicating that the positive ESD event occurs at the common port 40. However, the TLP current remains at approximately 0 mA, indicating that the positive ESD event occurring at the common port 40 is effectively discharged. When the TLP voltage rises to approximately sixty-three volts (63 V) at point C, the TLP current start to rise sharply, indicating that the RF switching circuit 106 is no longer able to discharge the positive ESD event. As a result, the RF switching circuit 106 could be damaged.

Figure 6B:
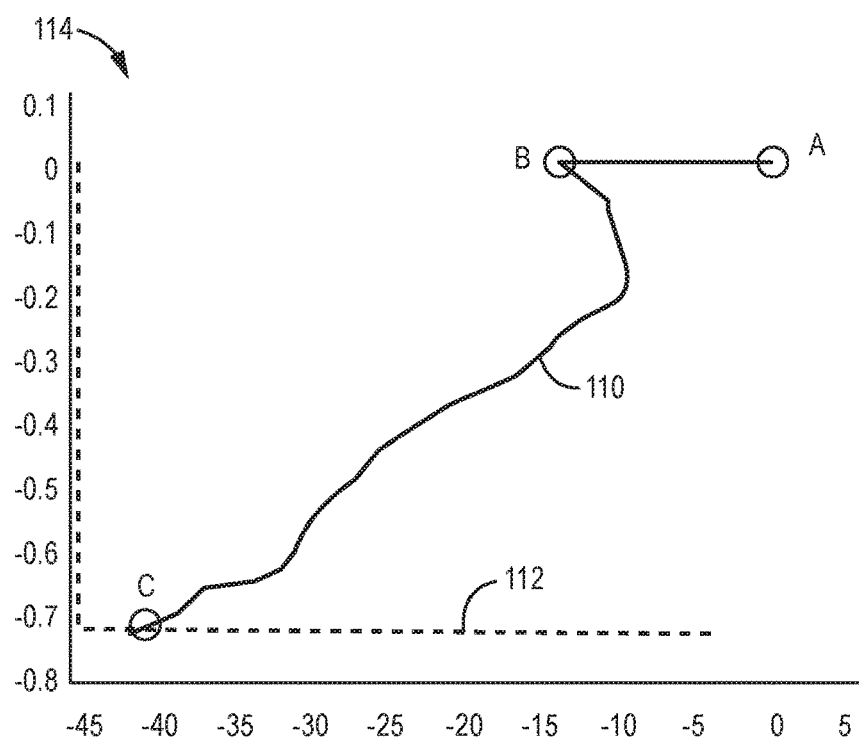
FIG. 6B is a TLP plot providing an exemplary illustration of discharging a negative ESD event from an RF antenna port in the RF switching circuit of FIG. 5.

FIG. 6B is a TLP plot 114 providing an exemplary illustration of discharging the negative ESD event from the common port 40 (RF antenna port) in the RF switching circuit 106 of FIG. 5. The TLP plot 114 is similar to the TLP plot 108 of FIG. 6A, except operating in reverse.

With reference back to FIG. 5, when the positive ESD event or the negative ESD event occurs at the first I/O port 44(1), the controller 64 controls the switching circuitry 50 to couple the receiver branch ESD clamp 60(1) to the first shunt branch ESD clamp 62(1) and/or the second shunt branch ESD clamp 62(2) for discharging the positive ESD event or the negative ESD event to the ground rail 48. Similarly, when the positive ESD event or the negative ESD event occurs at the second I/O port 44(2), the controller 64 controls the switching circuitry 50 to couple the transmitter branch ESD clamp 60(2) to the first shunt branch ESD clamp 62(1) and/or the second shunt branch ESD clamp 62(2) for discharging the positive ESD event or the negative ESD event to the ground rail 48.

Effectiveness of the RF switching circuit 106 in discharging the positive ESD event and the negative ESD event at the first I/O port 44(1) can also be illustrated via TLP plots, as discussed next with reference to FIGS. 7A and 7B. In this regard, FIG. 7A is a TLP plot 116 providing an exemplary illustration of discharging the positive ESD event from the first I/O port 44(1) (RF receiver port) in the RF switching circuit 106 of FIG. 5.

Figure 7A:
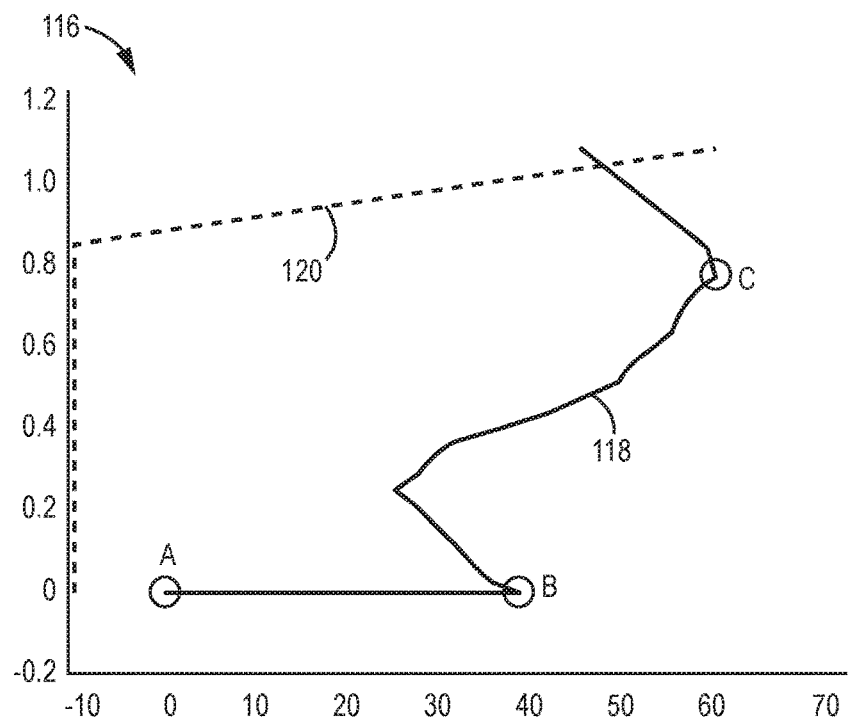
FIG. 7A is a TLP plot providing an exemplary illustration of discharging a positive ESD event from an RF receiver port in the RF switching circuit of FIG. 5.

With reference to FIG. 7A, the TLP plot 116 includes a TLP voltage curve 118 indicating voltage changes at the first I/O port 44(1) and a TLP current curve 120 indicating current changes in the RF switching circuit 106. At point A, there is a 0 V TLP voltage at the first I/O port 44(1), and the corresponding TLP current in the RF switching circuit 106 is 0 mA, indicating that the RF switching circuit 106 is OFF. At point B, the TLP voltage at the first I/O port 44(1) reaches approximately thirty-five volts (35 V), indicating that the positive ESD event occurs at the first I/O port 44(1). However, the TLP current remains at approximately 0 mA, indicating that the positive ESD event occurring at the first I/O port 44(1) is effectively discharged. When the TLP voltage rises to approximately fifty-five volts (55 V) at point C, the TLP current starts to rise sharply, indicating that the RF switching circuit 106 is no longer able to discharge the positive ESD event. As a result, the RF switching circuit 106 could be damaged.

Figure 7B:
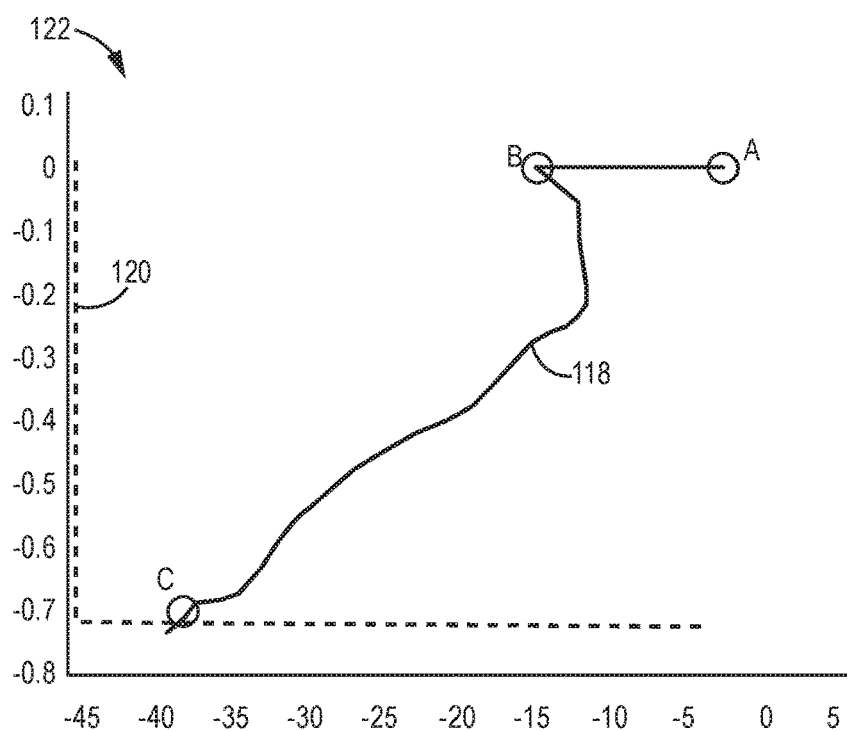
FIG. 7B is a TLP plot providing an exemplary illustration of discharging a negative ESD event from an RF receiver port in the RF switching circuit of FIG. 5.

FIG. 7B is a TLP plot 122 providing an exemplary illustration of discharging the negative ESD event from the first I/O port 44(1) (RF receiver port) in the RF switching circuit 106 of FIG. 5. The TLP plot 122 is similar to the TLP plot 116 of FIG. 7A, except operating in reverse.

Figure 8A:
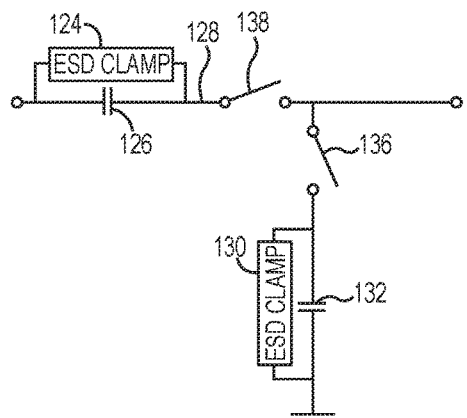
FIGS. 8A-8Q are schematic diagrams of exemplary electronic circuits that can employ the symmetrical ESD clamp of FIG. 3A for ESD protection.

The symmetrical ESD clamp 68 of FIG. 3A can be disposed in parallel to block capacitor elements to provide ESD protection in a variety of electronic circuits that are sensitive to parasitic loading. In this regard, FIGS. 8A-8Q are schematic diagrams of exemplary electronic circuits that can employ the symmetrical ESD clamp 68 of FIG. 3A for ESD protection. Common elements between FIGS. 5 and 8A-8Q are shown therein with common element numbers and will not be re-described herein.

Figure 8B:
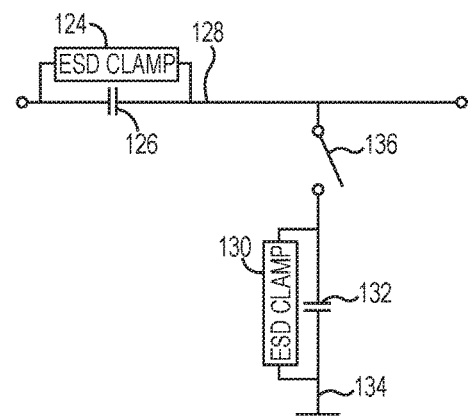

FIGS. 8A and 8B illustrate exemplary electronic circuits incorporating a first ESD clamp 124 disposed in parallel to a first blocking capacitor element 126 in a signal branch 128. A second ESD clamp 130 is disposed in parallel to a second blocking capacitor element 132 in a shunt branch 134. In FIG. 8A, the controller 64 of FIG. 5 can couple the signal branch 128 with the shunt branch 134 via a first switch 136 and a second switch 138. In FIG. 8B, the controller 64 can couple the signal branch 128 with the shunt branch 134 via the first switch 136. In a non-limiting example, the electronic circuits of FIGS. 8A and 8B can be low noise amplifier (LNA) circuits.

Figure 8C:
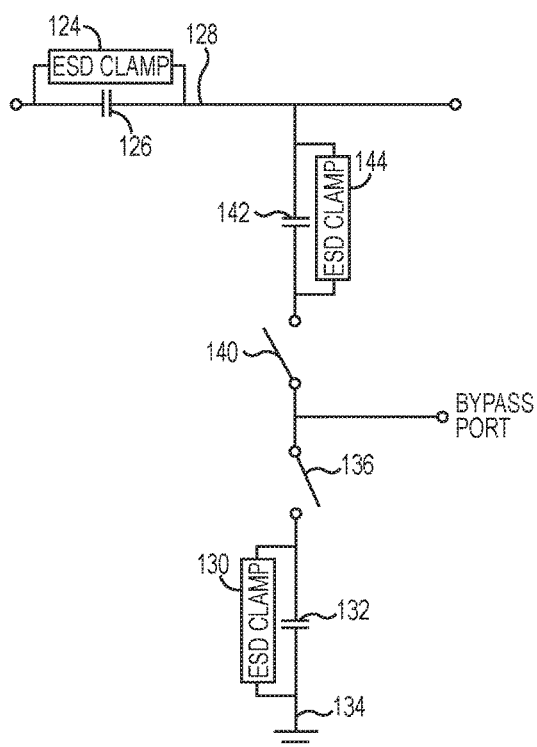
Figure 8D:
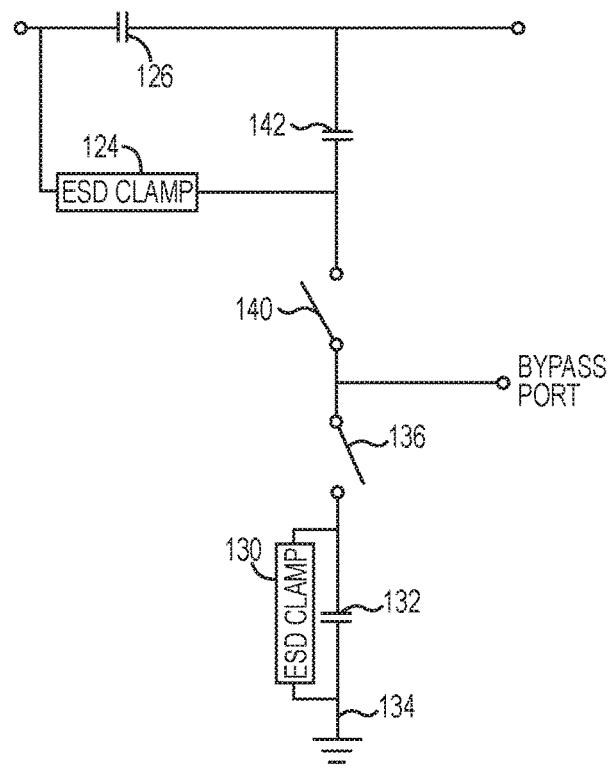
Figure 8E:
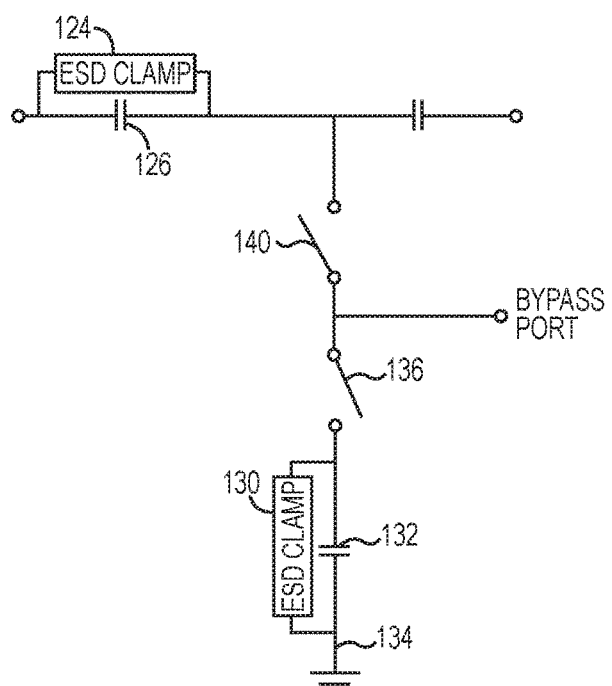
Figure 8F:
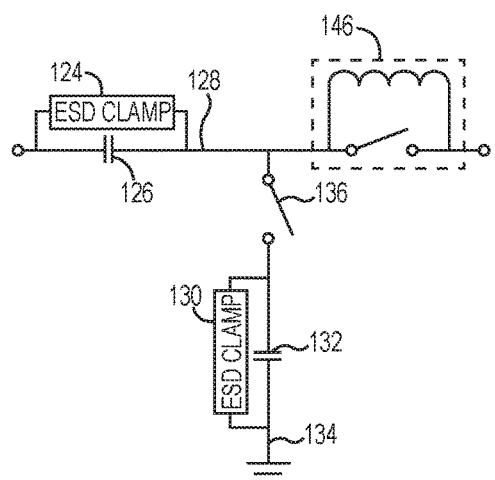
Figure 8G:
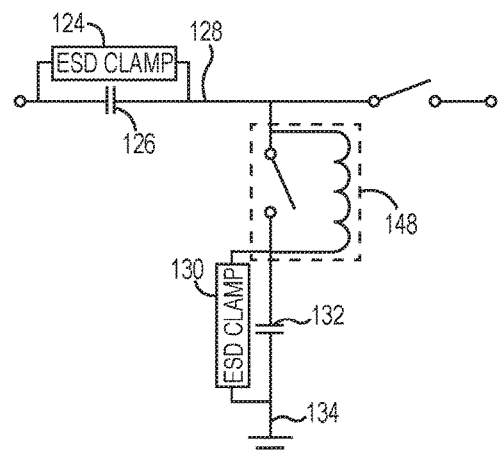
Figure 8H:
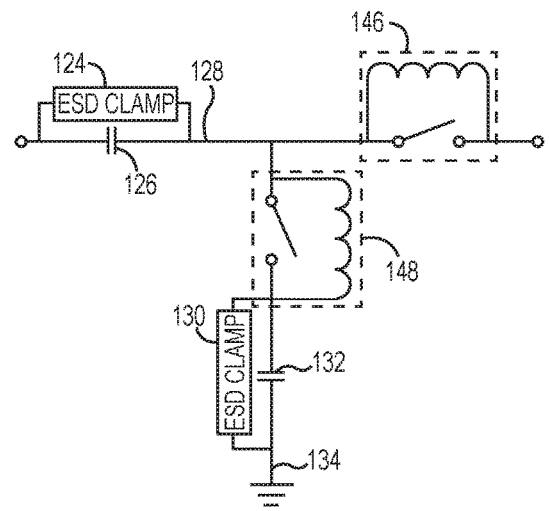

FIGS. 8C-8E illustrate exemplary electronic circuits incorporating a bypass switch 140 in the shunt branch 134. In FIG. 8C, the shunt branch 134 includes a third blocking capacitor element 142 disposed between the signal branch 128 and the bypass switch 140 and a third ESD clamp 144 is disposed in parallel to the third blocking capacitor element 142. In FIG. 8D, the first ESD clamp 124 is disposed in parallel to both the first blocking capacitor element 126 and the third blocking capacitor element 142. In FIG. 8E, the bypass switch 140 can be coupled directly to the signal branch 128. In a non-limiting example, the controller 64 controls the first switch 136 and the bypass switch 140 of FIGS. 8C-8E.

FIGS. 8F-8K illustrate exemplary electronic circuits utilizing parallel inductor-switch combination for resonant isolation designs. In the electronic circuit of FIG. 8F, a first parallel inductor-switch combination 146 is provided in the signal branch 128. In the electronic circuit of FIG. 8G, a second parallel inductor-switch combination 148 is disposed between the signal branch 128 and the second blocking capacitor element 132 in the shunt branch 134. The electronic circuit of FIG. 8H includes both the first parallel inductor-switch combination 146 and the second parallel inductor-switch combination 148. The electronic circuit of FIG. 8I includes a third parallel inductor-switch combination 150 disposed between the first blocking capacitor element 126 and the first switch 136 in the shunt branch 134. In the electronic circuit of FIG. 8J, the third parallel inductor-switch combination 150 is replaced by the second switch 138. The electronic circuit of FIG. 8K includes both the second parallel inductor-switch combination 148 and the third parallel inductor-switch combination 150.

FIGS. 8L-8O illustrate exemplary electronic circuits utilizing parallel inductor-capacitor combination for resonant isolation designs. In the electronic circuit of FIG. 8L, a first parallel inductor-capacitor combination 152 is provided in the signal branch 128. In the electronic circuit of FIG. 8M, a second parallel inductor-capacitor combination 154 is disposed between the signal branch 128 and the second blocking capacitor element 132 in the shunt branch 134. The electronic circuit of FIG. 8N includes both the first parallel inductor-capacitor combination 152 and the second parallel inductor-capacitor combination 154. The electronic circuit of FIG. 8O includes a third parallel inductor-capacitor combination 156 disposed between the first blocking capacitor element 126 and the first switch 136 in the shunt branch 134. In the electronic circuit of FIG. 8P, the third parallel inductor-capacitor combination 156 is replaced by the second switch 138. The electronic circuit of FIG. 8Q includes both the second parallel inductor-capacitor combination 154 and the third parallel inductor-capacitor combination 156.

Those skilled in the art will recognize improvements and modifications to the embodiments of the present disclosure. All such improvements and modifications are considered within the scope of the concepts disclosed herein and the claims that follow.

What is claimed is:

1. An electronic switching circuit comprising:
   switching circuitry;
   at least one common branch comprising a first blocking capacitor element provided between a common port and the switching circuitry;
   at least one input/output (I/O) branch comprising a second blocking capacitor element provided between the switching circuitry and an I/O port;
   a common branch electrostatic discharge (ESD) clamp disposed in parallel to the first blocking capacitor element for discharging an ESD event around the first blocking capacitor element; and
   an I/O branch ESD clamp disposed in parallel to the second blocking capacitor element for discharging the ESD event around the second blocking capacitor element.

2. The electronic switching circuit of claim 1 further comprising:
   at least one shunt branch comprising a third blocking capacitor element provided between the switching circuitry and a ground rail; and
   a shunt branch ESD clamp disposed in parallel to the third blocking capacitor element for discharging the ESD event around the third blocking capacitor element to the ground rail.

3. The electronic switching circuit of claim 2 wherein:
   the switching circuitry is configured to couple the common branch ESD clamp to the shunt branch ESD clamp when the ESD event occurs at the common port in the at least one common branch; and
   the common branch ESD clamp is configured to discharge the ESD event from the common port to the ground rail via the shunt branch ESD clamp.

4. The electronic switching circuit of claim 2 wherein:
   the switching circuitry is configured to couple the I/O branch ESD clamp to the shunt branch ESD clamp when the ESD event occurs at the I/O port in the at least one I/O branch; and
   the I/O branch ESD clamp is configured to discharge the ESD event from the I/O port to the ground rail via the shunt branch ESD clamp.

5. The electronic switching circuit of claim 2 wherein:
   the switching circuitry is configured to couple the common branch ESD clamp and the I/O branch ESD clamp to the shunt branch ESD clamp when the ESD event occurs at the common port in the at least one common branch and at the I/O port in the at least one I/O branch;
   the common branch ESD clamp is configured to discharge the ESD event from the common port to the ground rail via the shunt branch ESD clamp; and
   the I/O branch ESD clamp is configured to discharge the ESD event from the I/O port to the ground rail via the shunt branch ESD clamp.

6. The electronic switching circuit of claim 2 wherein the common branch ESD clamp is configured to discharge the ESD event around the first blocking capacitor element in response to a first positive voltage spike placed between the common port and the ground rail being higher than a first positive trigger voltage of the common branch ESD clamp.

7. The electronic switching circuit of claim 2 wherein the I/O branch ESD clamp is configured to discharge the ESD event around the second blocking capacitor element in response to a second positive voltage spike placed between the I/O port and the ground rail being higher than a second positive trigger voltage of the I/O branch ESD clamp.

8. The electronic switching circuit of claim 2 wherein:
the common branch ESD clamp is configured to discharge the ESD event around the first blocking capacitor element in response to a first positive voltage spike placed between the common port and the ground rail being higher than a first positive trigger voltage of the common branch ESD clamp; and
the I/O branch ESD clamp is configured to discharge the ESD event around the second blocking capacitor element in response to a second positive voltage spike placed between the I/O port and the ground rail being higher than a second positive trigger voltage of the I/O branch ESD clamp.

9. The electronic switching circuit of claim 2 wherein the common branch ESD clamp is configured to discharge the ESD event around the first blocking capacitor element in response to a first negative voltage spike placed between the common port and the ground rail being lower than a first negative trigger voltage of the common branch ESD clamp.

10. The electronic switching circuit of claim 2 wherein the I/O branch ESD clamp is configured to discharge the ESD event around the second blocking capacitor element in response to a second negative voltage spike placed between the I/O port and the ground rail being lower than a second negative trigger voltage of the I/O branch ESD clamp.

11. The electronic switching circuit of claim 2 wherein:
the common branch ESD clamp is configured to discharge the ESD event around the first blocking capacitor element in response to a first negative voltage spike placed between the common port and the ground rail being lower than a first negative trigger voltage of the common branch ESD clamp; and
the I/O branch ESD clamp is configured to discharge the ESD event around the second blocking capacitor element in response to a second negative voltage spike placed between the I/O port and the ground rail being lower than a second negative trigger voltage of the I/O branch ESD clamp.

12. The electronic switching circuit of claim 2 wherein the common branch ESD clamp comprises:
a first trigger resistor comprising a first gate end and a first source end;
a second trigger resistor comprising a second gate end and a second source end;
a first transistor comprising a first drain electrode, a first gate electrode, and a first source electrode, wherein:
the first drain electrode is coupled to the common port;
the first gate electrode is coupled to the first gate end of the first trigger resistor; and
the first source electrode is coupled to the first source end of the first trigger resistor and the second source end of the second trigger resistor; and
a second transistor comprising a second drain electrode, a second gate electrode, and a second source electrode, wherein:
the second drain electrode is coupled to the switching circuitry;
the second gate electrode is coupled to the second gate end of the second trigger resistor; and
the second source electrode is coupled to the first source electrode of the first transistor.

13. The electronic switching circuit of claim 12 wherein:
the first transistor is substantially identical to the second transistor; and the first trigger resistor and the second trigger resistor have a substantially equal resistance.

14. The electronic switching circuit of claim 2 wherein the I/O branch ESD clamp comprises:
a first trigger resistor comprising a first gate end and a first source end;
a second trigger resistor comprising a second gate end and a second source end;
a first transistor comprising a first drain electrode, a first gate electrode, and a first source electrode, wherein:
the first drain electrode is coupled to the I/O port;
the first gate electrode is coupled to the first gate end of the first trigger resistor; and
the first source electrode is coupled to the first source end of the first trigger resistor and the second source end of the second trigger resistor; and
a second transistor comprising a second drain electrode, a second gate electrode, and a second source electrode, wherein:
the second drain electrode is coupled to the switching circuitry;
the second gate electrode is coupled to the second gate end of the second trigger resistor; and
the second source electrode is coupled to the first source electrode of the first transistor.

15. The electronic switching circuit of claim 14 wherein:
the first transistor is substantially identical to the second transistor; and
the first trigger resistor and the second trigger resistor have a substantially equal resistance.

16. The electronic switching circuit of claim 2 wherein the shunt branch ESD clamp comprises:
a first trigger resistor comprising a first gate end and a first source end; and
a first transistor comprising a first drain electrode, a first gate electrode, and a first source electrode, wherein:
the first drain electrode is coupled to the switching circuitry;
the first gate electrode is coupled to the first gate end of the first trigger resistor; and
the first source electrode is coupled to the first source end of the first trigger resistor and the ground rail.

17. The electronic switching circuit of claim 2 wherein at least one of the first blocking capacitor element, the second blocking capacitor element, and the third blocking capacitor element is a direct-current (DC) blocking element.

18. The electronic switching circuit of claim 2 wherein at least one of the first blocking capacitor element, the second blocking capacitor element, and the third blocking capacitor element is a matching element.

19. The electronic switching circuit of claim 1 wherein:
the first blocking capacitor element is provided between a radio frequency (RF) antenna port and the switching circuitry; and
the at least one I/O branch comprises a first I/O branch and a second I/O branch, wherein:
the first I/O branch comprises a receiver branch blocking capacitor element provided between the switching circuitry and an RF receiver port;
the second I/O branch comprises a transmitter branch blocking capacitor element provided between the switching circuitry and an RF transmitter port; and
a receiver branch ESD clamp is disposed in parallel to the receiver branch blocking capacitor element for discharging the ESD event around the receiver branch blocking capacitor element.

20. The electronic switching circuit of claim 19 wherein a transmitter branch ESD clamp is disposed in parallel to the transmitter branch blocking capacitor element for discharging the ESD event around the transmitter branch blocking capacitor element.

\* \* \* \* \*

UNITED STATES PATENT AND TRADEMARK OFFICE
CERTIFICATE OF CORRECTION

PATENT NO. : 10,354,994 B2
APPLICATION NO. : 15/298430
DATED : July 16, 2019
INVENTOR(S) : David Robbins and Swaminathan Muthukrishnan Page 1 of 1

It is certified that error appears in the above-identified patent and that said Letters Patent is hereby corrected as shown below:

In the Specification

Figure 8I:
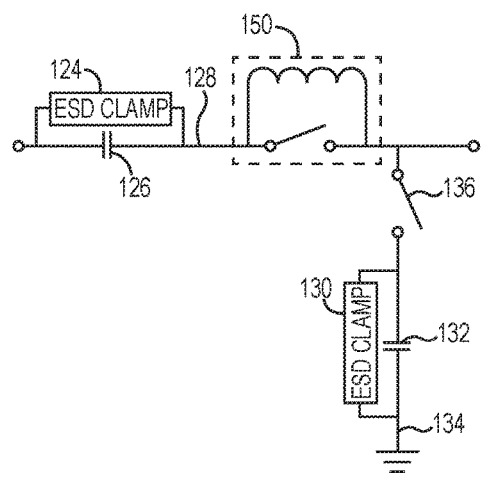
Figure 8J:
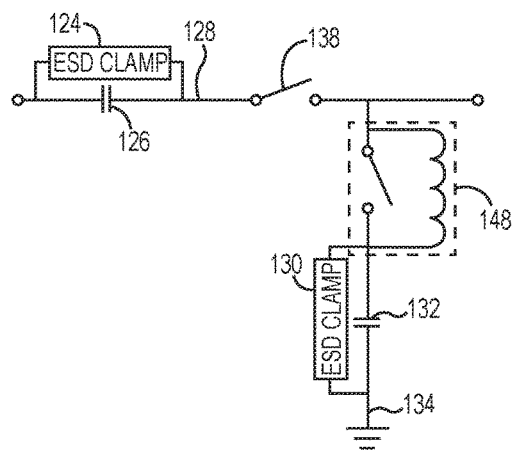
Figure 8K:
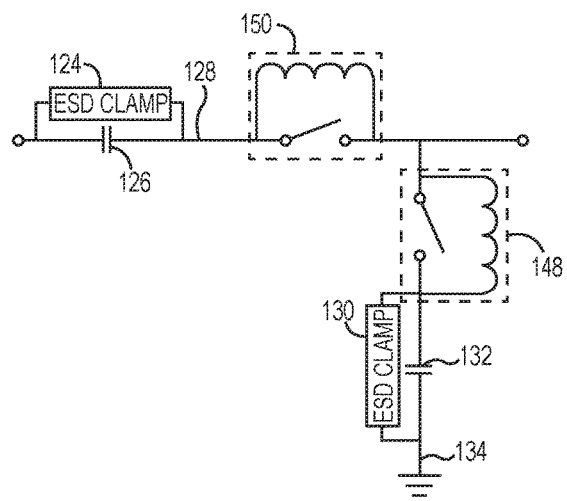
Figure 8L:
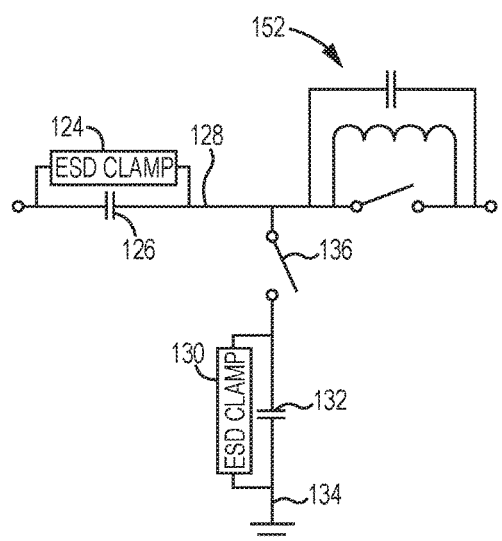
Figure 8M:
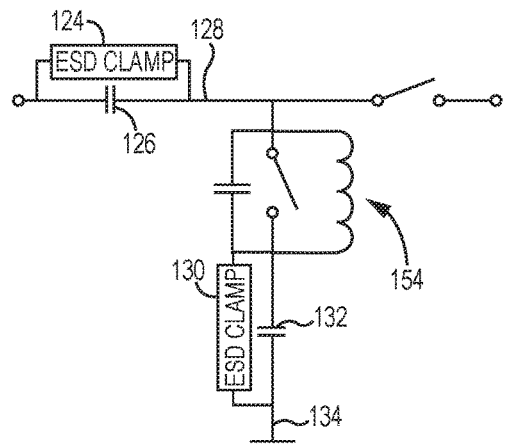
Figure 8N:
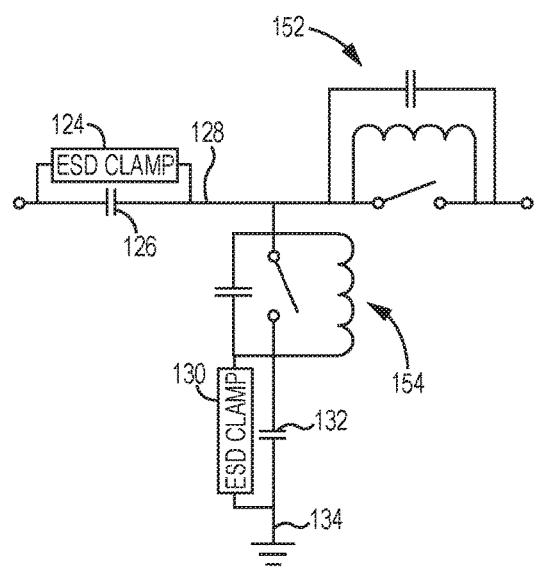

In Column 11, Line 39, replace "FIG. 81" with --FIG. 8I--.

Figure 8O:
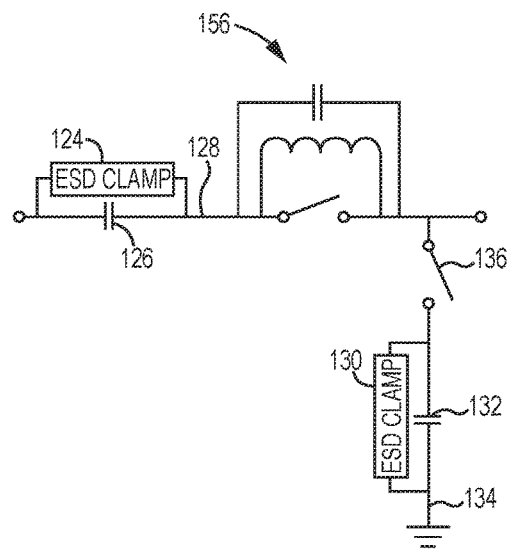
Figure 8P:
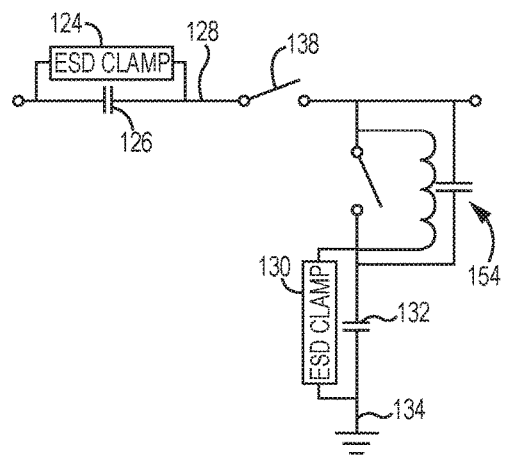
Figure 8Q:
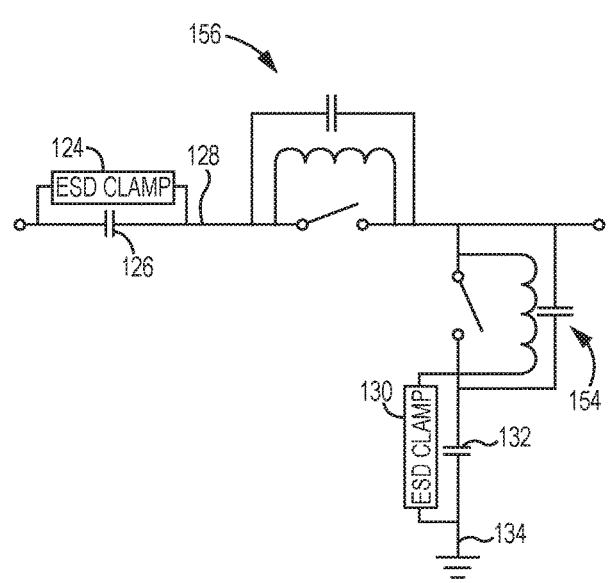

In Column 11, Line 58, replace "FIG. 80" with --FIG. 8O--.

Signed and Sealed this
Twenty-seventh Day of August, 2019

Andrei Iancu
*Director of the United States Patent and Trademark Office*